United States Patent [19]

Bitaillou et al.

[11] Patent Number: 4,462,534

[45] Date of Patent: Jul. 31, 1984

[54] METHOD OF BONDING CONNECTING PINS TO THE EYELETS OF CONDUCTORS FORMED ON A CERAMIC SUBSTRATE

[75] Inventors: Alex Bitaillou, Bretigny sur Orge; Jean Masson, Noisy/Ecole; Jean-Marie Lemoine, Saint-Michel-sur-orge, all of France

[73] Assignee: International Business Machines Corporation, Armonk, N.Y.

[21] Appl. No.: 452,530

[22] Filed: Dec. 23, 1982

[30] Foreign Application Priority Data

Dec. 29, 1981 [EP] European Pat. Off. ........ 81430045.5

[51] Int. Cl.³ ............................................... B23K 3/02
[52] U.S. Cl. ................................... 228/180 A; 228/246
[58] Field of Search ............... 228/180 R, 180 A, 245, 228/246

[56] References Cited

U.S. PATENT DOCUMENTS

| 3,292,240 | 12/1966 | McNutt et al. | 228/180 A X |
| 3,719,981 | 3/1973 | Steitz | 228/180 R X |
| 4,332,341 | 6/1982 | Minetti | 228/180 A |
| 4,396,140 | 8/1983 | Jaffe et al. | 228/180 A X |
| 4,421,266 | 12/1983 | Boch | 228/180 A |

FOREIGN PATENT DOCUMENTS 651914 3/1979 U.S.S.R. ........................... 228/180 R

Primary Examiner—Kenneth J. Ramsey
Attorney, Agent, or Firm—Wolmar J. Stoffel

[57] ABSTRACT

This method of bonding the heads of connecting pins previously inserted in a ceramic substrate to the eyelets of conductors formed on the top surface of said substrate comprises the steps of: applying a droplet of flux to the head of each pin; applying a solder ball to the head of each pin where it is held in position because of the adhesive capacity of the flux; heating in a furnace containing a nitrogen atmosphere and having a peak temperature of 350° C. to cause a solder reflow; and allowing to cool to enable the solder to set and to provide a permanent electrical and mechanical bond between the head of the pins and the eyelets. This method is suitable for use in manufacturing electronic modules employed in computers.

10 Claims, 6 Drawing Figures

4,462,534

METHOD OF BONDING CONNECTING PINS TO THE EYELETS OF CONDUCTORS FORMED ON A CERAMIC SUBSTRATE

DESCRIPTION

This invention relates to the manufacturing of electronic modules and, more particularly, to a method of bonding the heads of connecting pins to the eyelets of conductors formed in accordance with a specific pattern upon the surface of a ceramic substrate.

Electronic modules are increasingly used in the semiconductor integrated circuit industry for packaging silicon chips. These modules usually comprise a ceramic substrate carrying a specific pattern of metallized conductors that connect solder pads on the chips to the pins (the so-called flip chip technique). The pins provide electrical and mechanical connections with the outside world. The assembly is usually protected by a metal or plastic cover. The ends of the conductors at those points where pins are provided take the form of eyelets. A major problem that is posed during fabrication of the modules is to provide adequate electrical and mechanical connection between the head, which usually forms a bulge, of a connecting pin and the eyelet of the corresponding conductor.

BACKGROUND ART

Many techniques have been developed in the past to provide electrical bonding of the eyelets and the heads of the pins.

A first conventional technique consists in applying a solder ring around the head of the pin and in then heating the module in a furnace. A description of this technique may be found in an article entitled "solder Ring Application Tool", by R. F. Buczac et al in IBM Technical Disclosure Bulletin, Vol. 12, No. 1, June 1969, pages 15-16.

In practice, this technique implies the use of cylindrical (i.e. headless) pins and as a result complicates the handling of substrates provided with such pins. Also, any slight displacement or faulty positioning of the solder ring may result in a defective bond or even in a short circuit between the heads of two pins.

It has also been proposed to effect the bond in an electrolytic bath as described in the article entitled "Pin Bonding Technique", by F. C. Campagna et al, in IBM Technical Disclosure Bulletin, Vol. 14, No. 11, April 1972, pages 3246 and 3247. This technique, in addition to being fairly complex, is highly contaminating, which can be detrimental to the reliability of the encapsulated module.

The substrates can also be tinned, using the well-known dipping technique. However, this technique is very expensive in terms of raw materials (flux, solder, perchlorethylene) and manpower (tinning and visual sorting).

Another conventional technique consists in tinning the substrates by means of a solder paste that is dispensed during positioning of the chip. This technique has two major disadvantages: the step of dispensing the paste onto the heads of the pins is difficult to perform, and solder residues, which are frequently present, may cause short circuits between the conductors.

A similar technique is described in an article entitled "Solder Creme Dispensing Nozzle", by G. Sabol and J. Siwy, in IBM Technical Disclosure Bulletin, Vol. 14, No. 7, December 1971, Page 2090.

All of the above techniques require that the heads of the connecting pins be bonded to the eyelets of the conductors before the solder balls on the semiconductor chips are bonded to the conductive fingers on the ceramic substrate. In such cases, some solder frequently happens to come in contact with said fingers, thereby making the chip more difficult to align. One of the solutions that have been proposed consists in performing an additional brushing step to remove such unwanted solder.

DISCLOSURE OF INVENTION

The above difficulties are overcome by the method of the present invention, the main feature of which is as described in claim 1 and the principle of which is to deposit solder balls on the previously fluxed heads of the connecting pins. The bonding of the heads to the eyelets of the conductors is carried out in a furnace by solder reflow, which may be done, for example, simultaneously with the bonding of the semiconductor chips to the conductive fingers.

In more detail, the present method comprises the steps of:

applying a droplet of flux onto the head of each connecting pin, applying a solder ball onto the head of each pin, where it remains because of the adhesive capacity of the flux, heating thereby causing a solder reflow and permanently bonding the heads of the connecting pins to the corresponding eyelets, and allowing to cool to enable the solder to set.

Appropriate devices, the development of which proved particularly difficult are used to apply a solder ball to the head of each connecting pin. These devices are also described in the claims.

The present method can easily be automated and its reliability is practically perfect.

BRIEF DESCRIPTION OF THE DRAWINGS

The invention is described in detail hereinafter with reference to the accompanying drawings, which only show a preferred embodiment thereof.

BEST MODE FOR CARRYING OUT THE INVENTION

Figure 1:
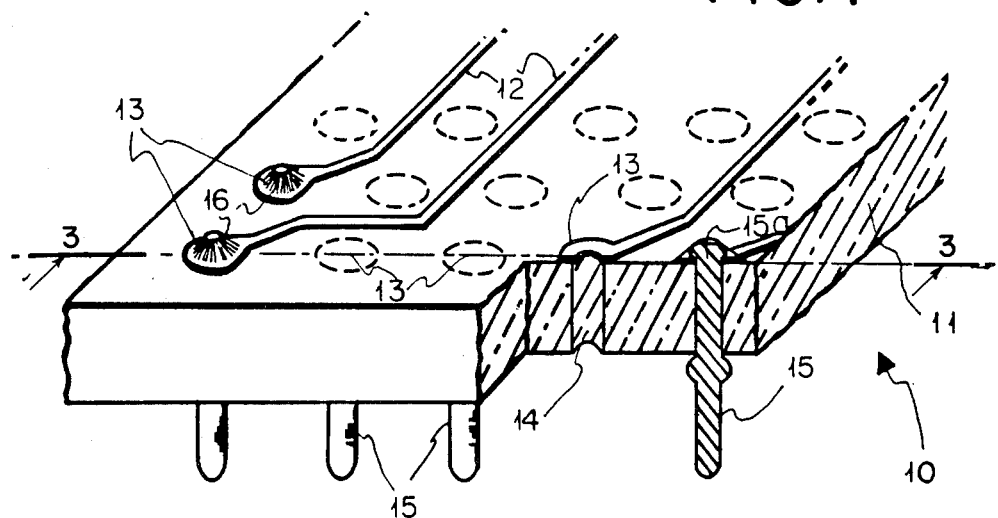
FIG. 1 is a partly exploded view of a portion of conventional electronic module whose cover has been removed, and shows the metalized ceramic substrate thereof.

Referring now to FIG. 1, there is shown a partially exploded view of a portion of a conventional electronic module 10 whose protective cover has been removed. The module comprises a ceramic substrate 11 provided with a pattern of metallized conductors 12. The end of each conductor 12 that corresponds to a hole 14 into which a connecting pin 15 is inserted, is enlarged and forms an eyelet 13.

It will be appreciated that many different patterns of metallized conductors and connecting pins are possible (although the pattern of pins usually is in accordance with a matrix and calls for a specific spacing).

The top of each pin 15 exhibits a bulge 15A which forms the head of the pin. After a pin has been inserted into a corresponding hole, its head 15A is soldered to the eyelet 13. This operation leaves a solder pad 16.

It is the object of this invention to provide a new method of performing this bonding operation whereby the heads of the connecting pins are mechanically and electrically bonded to the eyelets of the corresponding conductors.

Figure 3:
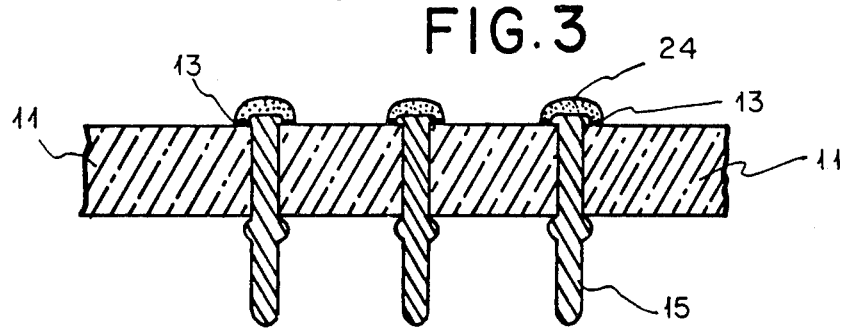
FIG. 3 is a schematic sectional view of the metallized ceramic substrate of FIG. 1, taken along lines 3—3 after fluxing.
Figure 2:
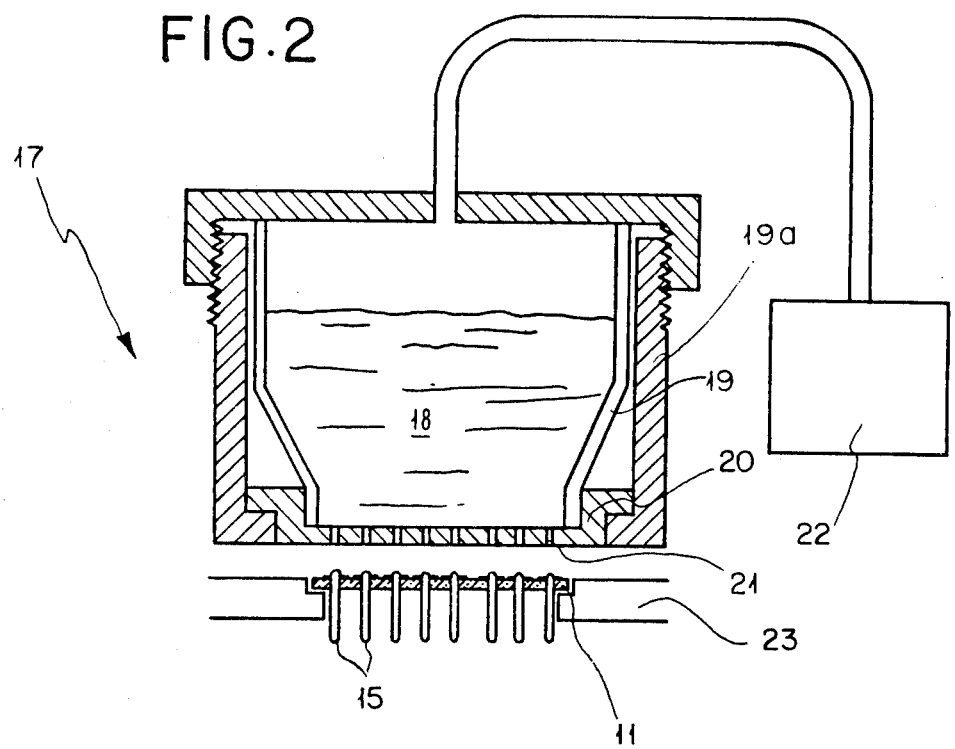
FIG. 2 shows the device used to apply a droplet of flux onto the head of each connecting pin.

The first step of this method consists in dispensing droplets of flux to be applied onto the heads of the pins. A flux dispensing device 17 is schematically shown in FIG. 2. A flux 18 (Benzylic 102-1500 manufactured by the Alpha Metals Co.) is contained in a Teflon tank 19 housed in a stainless steel cylinder 19A whose removable bottom, consisting of a wire cloth, forms a fluxing mask 20. The holes in the mask 20 are arranged in a pattern corresponding to the pattern of pins. The pressure within the tank 19 is established by a vacuum system 22 controlled, for example, by a logic circuit or by the analog output from a processor (not shown). The ceramic substrate 11 is positioned onto a support 23 fitted with locating pins (not shown). The flux remains in the tank 19 while the latter is being positioned over the substrate 11 and aligned therewith, and is then released by means of an air pulse supplied by the vacuum system 22. After removal of the device 17, there remains a droplet of flux 24 on the head of each pin, as shown in FIG. 3. It has been found that, assuming the use of pins with heads 0.7 mm in diameter, a spacing of 0.1 mm between the mask and the heads is desirable. Under these conditions, the holes 21 should have a diameter of 0.4 mm and the wire cloth constituting the fluxing mask should have a thickness of 1 mm.

The second step consists in using the other devices described hereafter to cause a solder ball to be dispensed and applied to the head of each pin, to which it will then adhere because of the adhesive capacity of the droplet of flux deposited thereon during the first step.

Figure 4A:
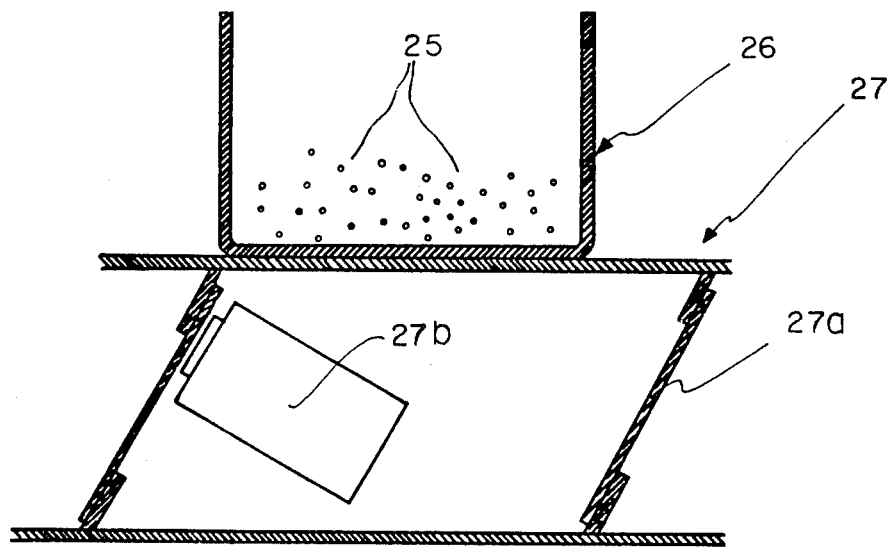
FIGS. 4A and 4B are illustrations of a device for agitating the solder balls and a suction device that dispenses said balls, respectively.

The solder balls selected for this application are 0.7 mm in diameter and the solder is an alloy of Pb-Sn (90/10). In view of their light weight, the solder balls should be agitated before they are drawn by suction. To this end, the solder balls are initially placed in a bowl 26 that is caused to vibrate using a vibrating device 27 as shown in FIG. 4A. The bowl 26 should be made of some elastic material so as to allow the balls to bounce. Polyethylene was found to be quite satisfactory for this purpose. By themselves, the vibrations proved insufficient to cause the solder balls to bounce. The optimum number of solder balls to be placed in the bowl was determined to correspond to a single layer of solder balls at the bottom of the bowl when not vibrated. In the preferred embodiment mentioned earlier, the bowl is a parallelepiped with a square base (70 mm × 70 mm) and a height of 80 mm. The vibrating device 27 comprises a plate resting on two oblique springs 27A, and an electromagnet 27B which causes said plate to vibrate.

Under the above conditions, the bouncing solder balls reached a height of about 20 mm. Other means could of course be employed for vibrating the solder balls, such as a container having a porous bottom and receiving compressed air.

Figure 4B:
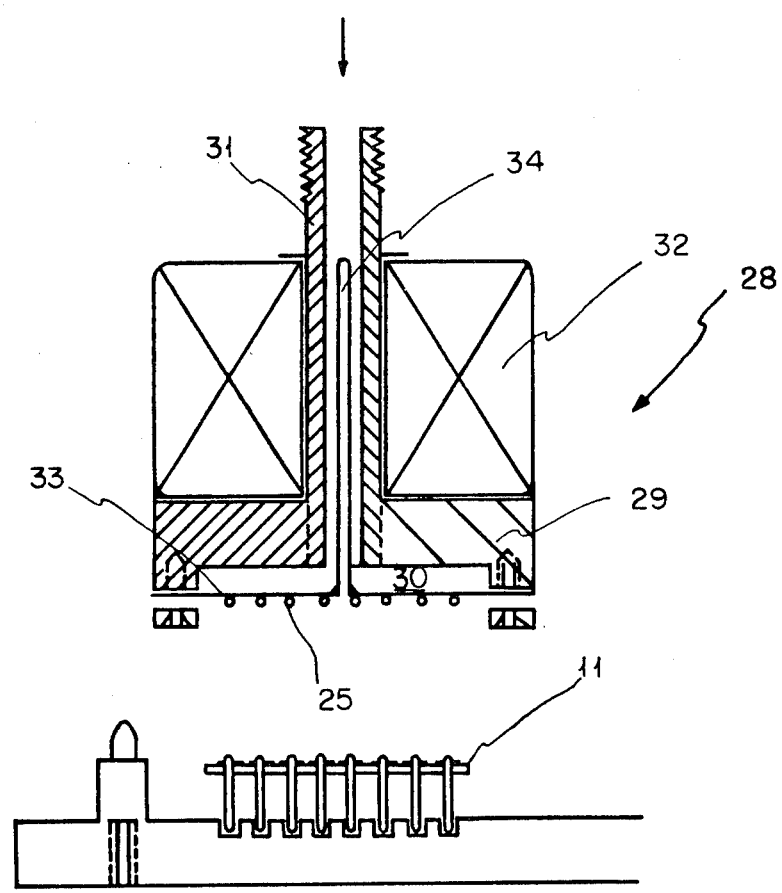

Refereing now to FIG. 4B, there is shown a suction device 28 which sucks up the moving solder balls contained in the vibrating bowl 26 and dispenses same to the previously fluxed substrate. The device 28 comprises a soft iron frame 29 which may be of circular shape and defines a suction chamber 30 connected by a tube 31 to a controlled vacuum system (not shown). An electromagnet 32 surrounds said tube and is fed from a main supply (50 Hz) through a diode. The suction chamber 30 is closed by a suction mask 33 fitted with a rod 34 whose far end is located within the air gap of the electromagnet. The mask 33 consists of a perforated membrane 0.1 mm in thickness that is made of an alloy of beryllium and copper. The holes in the membrane are 0.4 mm in diameter and correspond to the pattern of pins on the substrate.

The operation of the devices shown in FIGS. 4A and 4B is as follows. The device 27 is first operated to cause the solder balls 25 in the bowl 26 to vibrate. The device 28, previously connected to the vacuum source, is then inserted in the vibrating bowl such that the distance between the suction mask 33 and the bottom of the bowl is about 5 mm. The time necessary for all the solder balls to be sucked up is of the order of 1 second. The suction device 28, including the mask 33 with which the solder balls 26 are maintained in contact by the vacuum, is then removed from the bowl and positioned over the substrate 11 so that the pattern of solder balls and the pattern of pins are aligned; preferably, however, the patterns should be slightly offset with respect to each other to ensure that each ball rests over at least a portion of the corresponding eyelet. The patterns may be aligned through the use of locating pins (one of which is illustrated) provided on the support on which the electronic module rests and which fit into matching cavities (not shown) in the frame of the device 28. The solder balls are thus brought into contact with the corresponding droplets of flux. The vacuum system is then turned off, and the electromagnet is energized for about half a second to cause the membrane to vibrate. As a result, the solder balls separate more easily from the membrane while continuing to adhere to the heads of the pins because of the flux thereon.

Figure 5:
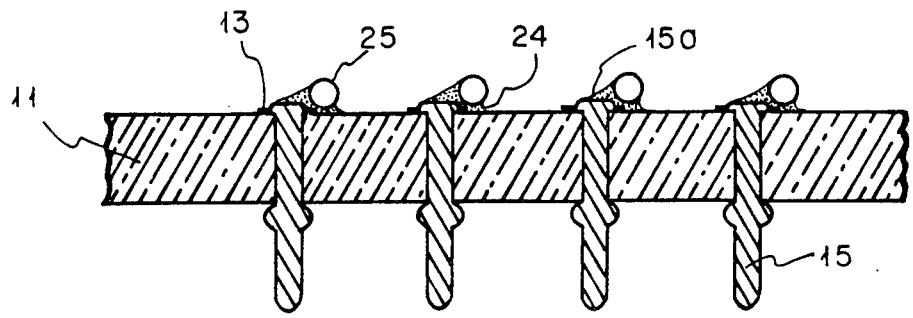
FIG. 5 is a schematic diagram of the substrate of FIG. 3 after the solder ball dispensing step.

FIG. 5 illustrates the configuration of the solder balls on the ceramic substrate and clearly shows the slight offset between the head 15A of each pin and the solder balls 25. The result of this offset is to improve the adherence of the solder balls to the flux and to provide a stronger bond between the heads of the pins and the eyelets, hence a better performance. The process is completed by conventionally dispensing droplets of flux (using, for example, equipment of the type illustrated in FIG. 2) to be applied onto the contact fingers at the ends of the conductors to correspond to the solder balls on the silicon chips, and by positioning the chips. Lastly, the ceramic substrate is introduced in a furnace containing a nitrogen atmosphere and having a peak temperature of 350° C. to cause solder reflow, thereby simultaneously bonding the chips to said fingers (the so-called flip chip technique) and the heads of the pins to the eyelets of the conductors.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A method of bonding the heads of connecting pins inserted in apertures in an insulating substrate to the corresponding eyelets which are disposed on the top surface of the substrate in accordance with a specific pattern, comprising the steps of:
   applying a droplet of flux to the head of each connecting pin adjacent to the corresponding eyelet,
   applying a solder ball to the head of each pin to which it will adhere because of the adhesive capacity of the flux previously deposited thereon,
   heating to cause a solder reflow, and
   allowing to cool so as to enable the solder to set and to provide a permanent electrical and mechanical bond between the head of the connecting pins and the eyelets.

2. The method of claim 1, characterized in that said solder balls are aligned with the heads of the pins, but slightly offset relative thereto.

3. The method of claim 1 or 2, characterized in that said eyelets form the ends of a pattern of conductors.

4. The method of claim 1 wherein the step of applying a droplet of flux includes:
   positioning over the substrate, and in proximity thereto, a tank containing a supply of flux and whose bottom is comprised of a grid forming a fluxing mask and having holes corresponding to said specific pattern, said tank being connected to a vacuum system that maintains a suitable vacuum during the positioning phase,
   causing said vacuum device to supply an air pulse to cause a droplet of flux to be applied to the head of each pin, and
   removing said tank.

5. The method of claim 1 characterized in that the step of applying a solder ball includes:
   vibrating the solder balls in a container,
   causing the moving solder balls to be drawn by suction and rest against a grid forming a suction mask and having holes therein arranged in a pattern corresponding to said specific pattern, said mask defining, together with a frame, a suction chamber connected to a vacuum system through a tube,
   positioning said suction mask over the substrate to align the solder balls with the heads of the pins, so as to cause the balls to come into contact with the corresponding droplets of flux, and
   causing said vacuum system to generate an air pulse to release the solder balls.

6. The method of claim 5 characterized in that said container is a vibrating bowl made of a material such as polyethylene allowing the solder balls to bounce, the vibrations being generated by a vibrating device.

7. The method of claim 6, characterized in that the number of solder balls in said vibrating bowl corresponds to a single layer of solder balls.

8. The method of claim 6 characterized in that said frame includes an electromagnet, in that said mask is fitted with a rod disposed in the air gap of said electromagnet, and in that said electromagnet is energized by an AC voltage source at the same time as said air pulse is generated, to thereby facilitate the release of the solder balls.

9. The method of claim 1 wherein said heating step is performed in a furnace containing a nitrogen atmosphere and having a peak temperature of 350° C.

10. The method of claim 9, characterized in that the bonding of the heads of the pins to the eyelets is carried out simultaneously with the bonding of the semiconductor chips to the fingers of the conductors on the substrate.

* * * * *